United States Patent [19]

Higuchi

[11] Patent Number: 4,710,900
[45] Date of Patent: Dec. 1, 1987

[54] NON-VOLATILE SEMICONDUCTOR MEMORY DEVICE HAVING AN IMPROVED WRITE CIRCUIT

[75] Inventor: Misao Higuchi, Tokyo, Japan
[73] Assignee: NEC Corporation, Tokyo, Japan
[21] Appl. No.: 814,472
[22] Filed: Dec. 30, 1985
[30] Foreign Application Priority Data Dec. 28, 1984 [JP] Japan .............................. 59-277434

[51] Int. Cl.$^4$ ................................................ G11C 7/00
[52] U.S. Cl. ..................................... 365/189; 365/185
[58] Field of Search ................ 365/189, 185, 230, 233

[56] References Cited
U.S. PATENT DOCUMENTS 4,565,932 1/1986 Kuo et al. ....................... 365/185 X
4,583,205 4/1986 Watanabe .......................... 365/189

Primary Examiner—Joseph A. Popek
Attorney, Agent, or Firm—Sughrue, Mion, Zinn, Macpeak & Seas

[57] ABSTRACT

A non-volatile semiconductor device having an improved write voltage application circuit, of the type having a plurality of non-volatile memory elements each coupled to a row line and a column line, and a write voltage application circuit provided for each row line for operatively applying a regulated amount of a write current to the row line in a write state. The write voltage application circuit includes a P-channel MIS transistor which is adapted to take a conductive state of a large resistance at least in a write state, for regulating the amount of the write current.

15 Claims, 5 Drawing Figures

NON-VOLATILE SEMICONDUCTOR MEMORY DEVICE HAVING AN IMPROVED WRITE CIRCUIT

BACKGROUND OF THE INVENTION

The present invention relates to a non-volatile semiconductor memory device made of semiconductor elements, and particularly to a write circuit for applying a high voltage to a memory cell.

Non-volatile semiconductor memory devices such as Electrically Programmable Read Only Memories (EPROMs), memory contents of which are erasable by ultra-violet rays, have been widely utilized in many kinds of electronic systems. As a memory cell of such EPROMs, an MIS transistor having a stacked gate structure has been mainly employed. The above type MIS transistor has a floating gate located above a channel region via an insulating layer and a control gate located above the floating gate via an insulating layer. The control gate of each MIS transistor is connected to a word line while a drain thereof is connected to a digit line in a matrix form. The memory state of each MIS transistor corresponds to a value of a threshold voltage which is determined by electric charge accumulated in its floating gate. Upon writing to an MIS transistor memory cell of the above type, potentials at its control gate and drain are raised with its source held at a ground potential so that avalanche breakdown is caused at the drain and hot electrons are injected to the floating gate, whereby a threshold voltage of the memory cell transistor is changed.

A conventional write voltage supply circuit for applying a high write voltage $V_{pp}$ to a control gate of a memory cell transistor in writing is comprised of a series circuit of a switching MIS transistor and a current limiting MIS transistor of a depletion type. Through this series circuit, the high write voltage $V_{pp}$ is applied to a control gate of a memory cell MIS transistor to be written. The purpose of using the current limiting MIS transistor is to limit a value of a current flowing the $V_{pp}$ voltage to the ground potential.

However, the current limiting transistor is of a depletion type and therefore, steps in manufacturing the memory is inevitably increased, thus raising cost and reducing yield in manufacturing. In addition, the current limiting transistor must have a relatively large resistance and hence a channel length of the current limiting transistor must be large. This has increased the size of a semiconductor chip on which a memory device is fabricated.

SUMMARY OF THE INVENTION

It is an object of the present invention to provide a non-volatile memory device which can be easily fabricated.

It is another object of the present invention to provide a non-volatile memory device having a large memory capacity and a high density structure.

The non-volatile semiconductor memory device according to the present invention is of the type having a plurality of non-volatile memory cells each coupled to a row line and a column line, a row selection circuit for selecting one of the row lines, electric charges on the non-selected row lines being discharged to a reference potential, and a plurality of write voltage application circuits each provided for each row line to apply thereto a write voltage, and is featured in that the write voltage circuit includes a P-channel MIS transistor which is adapted to assume a shallow conductive state at least in a write state and a current flowing through the above P-channel MIS transistor is applied to the row line.

In order to obtain the shallow conductive state of the above P-channel MIS transistor, the gate potential of the P-channel MIS transistor is adjusted at a voltage which is lower than the write voltage $V_{pp}$ by 2 to 3 volts.

According to the present invention, usage of a depletion MIS transistor in each write voltage application circuit is effectively avoided.

DETAILED DESCRIPTION OF THE INVENTION

Figure 1:
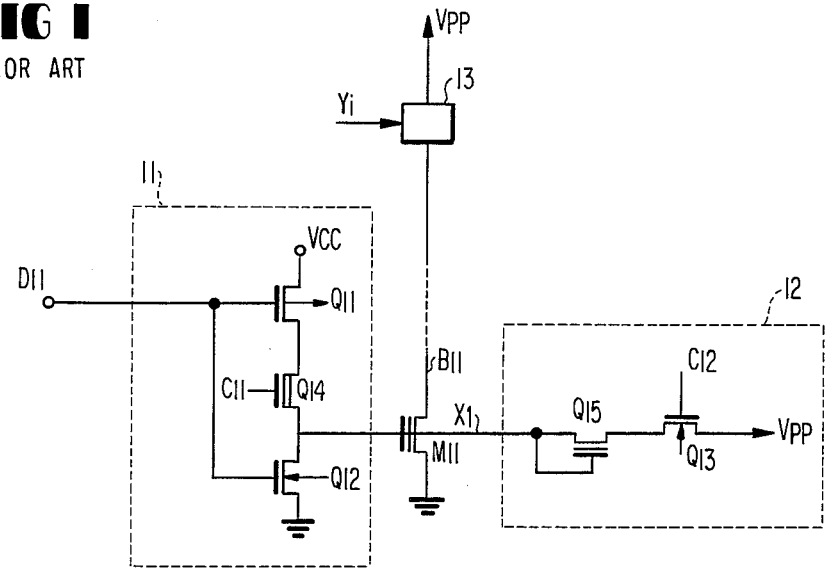
FIG. 1 is a schematic circuit diagram of a non-volatile memory device according to prior art.

Referring to FIG. 1, a major part including a write voltage applying circuit of a non-volatile memory device according to the prior art will be described.

Although a plurality of memory cells are arranged in a matrix form in a practical product, one memory cell and a writing scheme for this memory cell are illustrated in FIG. 1 for easier understanding.

The memory cell transistor $M_{11}$ is a so-called floating gate MIS transistor. Its floating gate is left unconnected to any circuit line while its control gate is connected to a word line $X_1$. A source of the transistor is connected to a ground potential while a drain of the transistor $M_{11}$ is connected to a digit line $B_{11}$ to which drains of other memory cell transistors in the same column (not shown) are connected. The digit line $B_{11}$ is connected to a load transistor $Q_L$ (not shown) and an input of an output amplifier (not shown) through a column selection circuit 13 which is selected by a column selection signal $Y_i$. A row driver circuit 11 is comprised of a P-channel MIS transistor $Q_{11}$, an N-channel MIS transistor $Q_{12}$, and an N-channel depletion type MIS transistor $Q_{14}$ which form an inverter circuit receiving a row decoder signal $D_{11}$. Throughout the explanation, MIS transistors which are not referred to as depletion MIS transistors are enhancement MIS transistors. A write voltage supply circuit 12 is composed of an N-channel MIS transistor $Q_{13}$ and an N-channel depletion MIS transistor $Q_{15}$ connected in series between a write voltage $V_{pp}$ and the word line $X_1$. In a write operation for the memory cell transistor $M_{11}$, a control signal $C_{12}$ is made high to make the transistor $Q_{13}$ conductive, while a control signal $C_{11}$ is rendered low to put the transistor $Q_{14}$ in a high resistance state and the row decoder signal $D_{11}$ is made high thereby to make the transistor $Q_{12}$ non-conductive. Therefore, a potential at the word line $X_1$ is put at nearly the write voltage $V_{pp}$ through the transistors $Q_{13}$ and $Q_{15}$. The write voltage $V_{pp}$ is higher than a power voltage $V_{cc}$. Typically, $V_{cc}$ is about 5 V and $V_{pp}$ is about 20 V. The column selection circuit 13 connects the digit line to $V_{pp}$ by a selected level of the column decoder signal $Y_i$. Thus, hot-electrons are injected to the floating gate of the transistor $M_{11}$ to raise the threshold voltage of the transistor $M_{11}$. In the case where the memory cell transistor $M_{11}$ is not selected in a write operation, the row decoder signal $D_{11}$ assumes a low level to render the transistor $Q_{12}$ conductive so that the potential at the word line $X_1$ is made nearly the ground potential. In this instance, the transistor $Q_{15}$ serves as a current limiter for suppressing an electric current flowing to the ground through the transistor $Q_{12}$ from $V_{pp}$. However, the transistor $Q_{15}$ is of a depletion type and hence manufacturing of the memory device has been complex and prolonged. Furthermore, the transistor $Q_{15}$ must have a large on-resistance and therefore, the transistor $Q_{15}$ is required to have a long channel region, resulting in larger a chip size.

Figure 2:
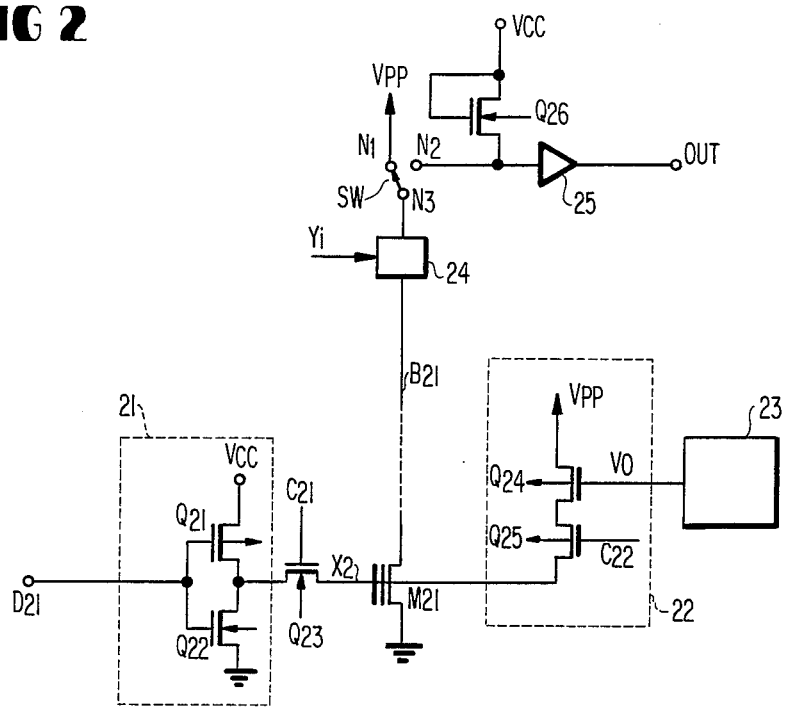
FIG. 2 is a schematic circuit diagram showing a major part of a non-volatile memory device according to the present invention.

Referring to FIG. 2, a major part of the non-volatile semiconductor memory according to the present invention will be described.

Figure 5:
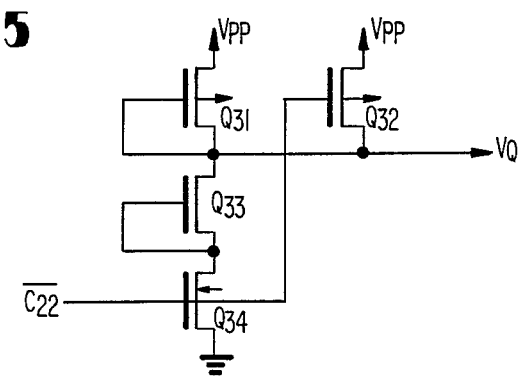
FIG. 5 is a schematic circuit diagram showing a constant voltage generating circuit used in the memory of FIGS. 3 and 4.

Similarly to FIG. 1, one memory cell transistor $M_{21}$ is representatively illustrated with a write scheme for the memory cell transistor $M_{21}$. A write voltage circuit 22 is comprised of a P-channel MIS transistor $Q_{24}$ and a P-channel MIS transistor $Q_{25}$ connected in series between the write voltage $V_{pp}$ and the word line $X_2$ connected to the control gate of the cell transistor $M_{21}$. A word driver circuit 21 includes a CMOS type inverter composed of a P-channel MIS transistor $Q_{21}$ and an N-channel MIS transistor $Q_{22}$ receiving a word decoder signal $D_{21}$. An output of the inverter is coupled to the word line $X_2$ through a source-drain path of an N-channel MIS transistor $Q_{23}$ receiving a predetermined potential $C_{21}$ at its gate. A source of the memory cell transistor $M_{21}$ is connected to the ground potential while its drain is connected to a digit line $B_{21}$ which is connected to a common node $N_3$ of a read-write selection switch SW via a column selection circuit 24 controlled by a digit decoder signal $Y_i$. The switch SW connects the common node $N_3$ to the write voltage $V_{pp}$ via a contact $N_1$ in a write state and to a node $N_2$ to which the power voltage $V_{cc}$ is applied through an N-channel MIS transistor $Q_{26}$ serving as a load element in a read state. An input of an output amplifier 25 is connected to the node $N_2$. In this arrangement, the significant feature resides in the write voltage apply circuit 22 made of P-channel MIS transistors $Q_{24}$ and $Q_{25}$. A voltage $V_0$ generated by a voltage generator 23 is applied to the gate of the transistor $Q_{24}$. This voltage $V_0$ has a value slightly lower than $V_{pp}$ so that the transistor $Q_{24}$ assumes a shallow conductive state. In other words, the transistor $Q_{24}$ takes a conductive state, but its on-resistance is relatively large. Accordingly, the transistor $Q_{24}$ serves as a current limitter of a current flowing into the ground via the transistor $Q_{22}$ in a write state. The transistor $Q_{25}$ serves as a switch and assumes a conductive state in a write operation and a non-conductive state in a read operation in response to a control signal $C_{22}$. In a write state, the transistor $Q_{23}$ takes a high impedance because the word line $X_2$ becomes $V_{pp}$ which is higher than $C_{21}$, i.e., $V_{cc}$ thereby isolates the word line $X_2$ from $V_{cc}$. FIG. 5 shows an example of a circuit of the voltage generator 23. A P-channel MIS transistor $Q_{31}$, N-channel depletion MIS transistor $Q_{33}$ and a N-channel MIS transistor $Q_{34}$ is connected in series between the write power voltage $V_{pp}$ and the ground potential. A P-channel MIS transistor $Q_{32}$ is connected in parallel with the transistor $Q_{31}$. A control signal $\overline{C_{22}}$ of the opposite phase with respect to the control signal $C_{22}$ is applied to the gates of the transistors $Q_{32}$ and $Q_{34}$. In a read state, the control signal $\overline{C_{22}}$ assumes the ground potential so that the transistor $Q_{32}$ takes a conductive state while the transistor $Q_{34}$ takes a non-conductive state. Accordingly, the output voltage $V_0$ is approximately equal to Vpp, while in a write state, the control signal $\overline{C_{22}}$ assumes a high level close to $V_{pp}$ so that the transistor $Q_{34}$ is conductive and the transistor $Q_{32}$ is non-conductive. As a result, the voltage $V_0$ takes an intermediate value "Vpp-$\alpha$" in which $\alpha$ is usually 2 to 3 volts for the case of Vpp=20 V.

Thus, the transistor $Q_{24}$ of the circuit takes a conductive state in a write state and a non-conductive state in a read state in response to the value of $V_0$.

Figure 3:
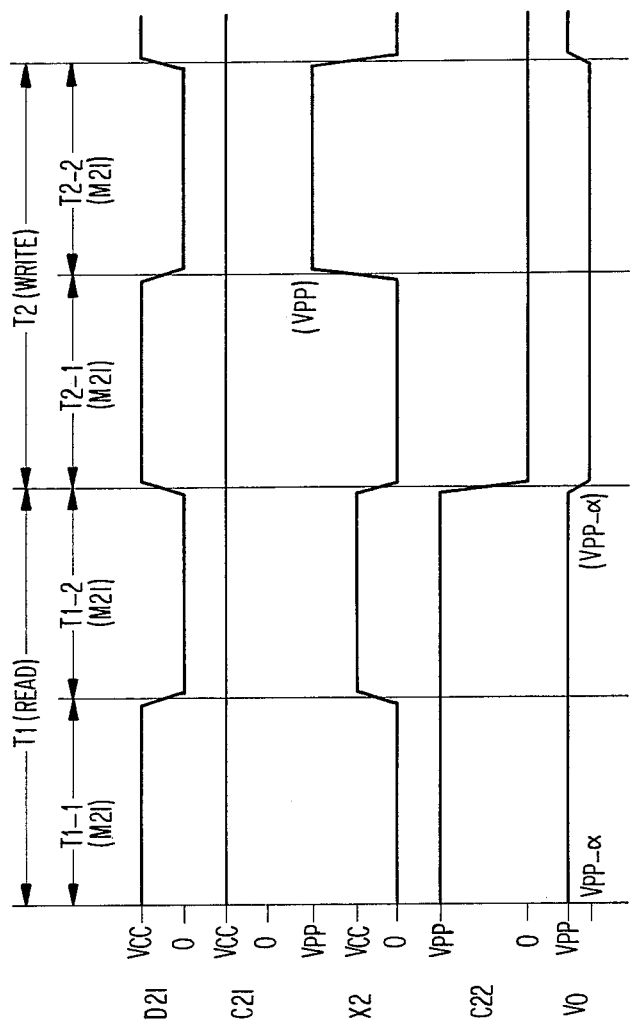
FIG. 3 is a timing chart showing the operation of the memory of FIG. 2.
Figure 4:
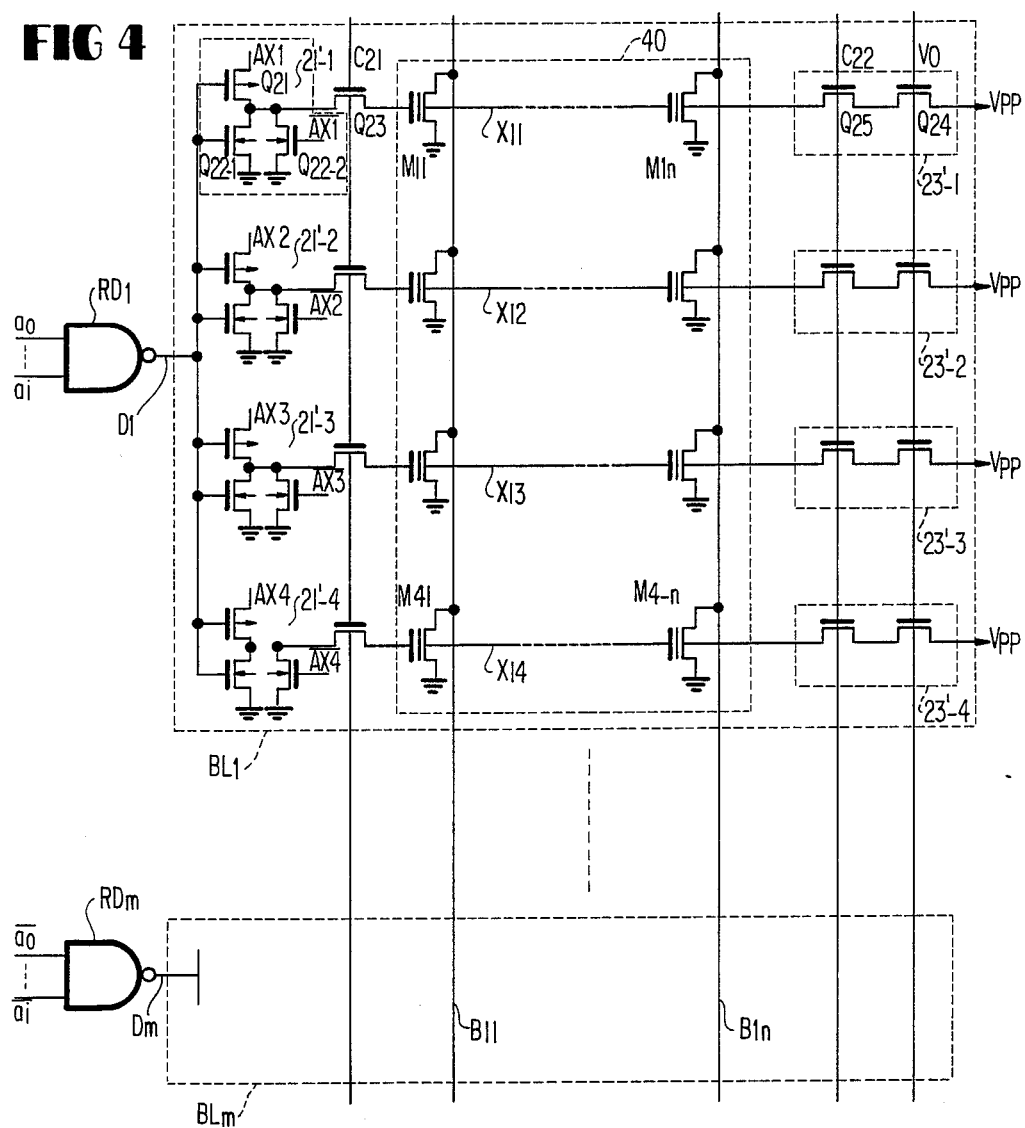
FIG. 4 is a schematic circuit diagram showing a practical memory array according to the present invention.

FIG. 4 shows waveforms in operations of the memory shown in FIGS. 3 and 5.

$T_1$ shows a shows a read period in which a period $T_{1-1}$ shows the case where the memory cell transistor $M_{21}$ is not selected. During the period $T_{1-1}$, the row decoder signal $D_{21}$ is at high to make the transistor $Q_{22}$ conductive. The potential $C_{21}$ is kept at $V_{cc}$ throughout the whole operation, while the control signal $C_{22}$ and the voltage $V_0$ are approximately at Vpp, so that the transistors $Q_{24}$ and $Q_{25}$ are non-conductive. Accordingly, the word line $X_2$ is at low in level. A period $T_{1-2}$ shows the case where the cell transistor $M_{21}$ is selected in a read cycle. In this instance, the row decoder signal $D_{21}$ is the ground potential and the transistor $Q_{21}$ is conducting, while the transistors $Q_{24}$ and $Q_{25}$ are still non-conducting. Therefore, the word line $X_2$ is raised in potential close to $V_{cc}$ via the transistors $Q_{21}$ and $Q_{23}$, while the digit line $B_{21}$ is connected to the node $N_2$ via the circuit 24, and the switch SW.

A write cycle is shown as $T_2$. A period $T_{2-1}$ shows the case where the cell transistor $M_{21}$ is not selected. During the period $T_{2-1}$, the control signal $C_{22}$ is approximately at the ground potential and the voltage $V_0$ is at the intermediate level of (Vpp-$\alpha$) so that the transistors $Q_{24}$ and $Q_{25}$ are conductive. However, the transistor $Q_{22}$ is conductive in response to the high level of $D_{21}$. Therefore, the word line $X_2$ is made approximately at the ground level through $Q_{22}$ and $Q_{23}$. In this instance, although there is a current path from Vpp to the ground level via $Q_{24}$ and $Q_{25}$, the transistor $Q_{24}$ operates to limit the current flowing therethrough. Thus, the potential of the word line $X_2$ is effectively set at the ground potential and the power consumption due to this current is also reduced.

A period $T_{2-2}$ is the case where the cell transistor $M_{21}$ is selected. In this instance, the row decoder signal $D_{21}$ is at the low level to make the transistor $Q_{22}$ non-conductive and the transistor $Q_{21}$ conductive. Therefore, the potential of the word line is raised to Vpp via the transistors $Q_{24}$ and $Q_{25}$, achieving the selection of the word line $X_2$. During this period $T_{2-2}$, Vpp is also applied to the drain of $M_{21}$ via the circuit 24 and the switch SW.

FIG. 4 shows a practical layout where a plurality of memory cell transistors are arranged in a matrix form. In FIG. 4, the portions corresponding to those in FIG. 2 are designated by similar references. Each consecutive four word lines, e.g. $X_{11}$ to $X_{14}$ and their word driving schemes are classified into blocks $BL_l$ to $BL_m$. Each of the blocks $BL_l$ to $BL_m$ has the same structure and the block $BL_l$ is representatively illustrated. Main row decoders $RD_l$ to $RD_m$ receiving row address signals $a_0$ to $a_i$, $a_0$ to $a_i$ provided for the blocks $BL_l$ to $BL_m$. Each of the main row decoders $RD_l$ to $RD_m$ selects its corresponding block, e.g. $BL_l$. For example, the low level of the output $D_1$ of the decoder $RD_l$ selects the block $BL_l$. A NOR type row address driver $21'-1$ receives the output $D_1$ and a sub row decoded signal $\overline{AX_1}$ and select the word line when both of $D_1$ and $\overline{AX_1}$ are low. Other row address drivers $21'-2$ to $21'-4$ have the same structure as $21'-1$ except different sub row decoded signals $\overline{AX_2}$, $\overline{AX_3}$ and $\overline{AX_4}$ are applied. The signals $\overline{AX_1}$ to $\overline{AX_4}$ are the signals obtained by decoding two bits of row address signals which are not applied to the decoders $RD_l$ to $RD_m$. The write voltage application circuits $23'-1$ to $23'-4$ are connected between the write voltage $V_{pp}$ and the word lines $X_{11}$ to $X_{14}$ in the block $BL_l$. The signal $C_{22}$ and the voltage $V_0$ are applied to all the write voltage circuits in common. Although not shown in FIG. 4, column selection scheme such as the circuits 24, switch SW, the transistor $Q_{26}$ and the amplifier 25 in FIG. 2 is provided in a known way.

As has been described above, according to the present invention, a non-volatile semiconductor memory having a high density structure can be fabricated without using depletion MIS transistors.

I claim:

1. A non-volatile semiconductor memory device comprising:
   a plurality of row lines;
   a plurality of column lines;
   a plurality of non-volatile memory cells each coupled to one of said row lines and one of said column lines;
   a row selection circuit responsive to row address information for selecting one of said row lines;
   a write voltage terminal to which a write voltage is applied; and
   a plurality of write voltage application circuits each coupled between each one of said row lines and said write voltage terminal for applying said write voltage thereto in a write state, each of said write voltage application circuits including a current limiting MIS transistor of an enhancement type through which a limited amount of current flows and means for connecting a source-drain path of said current limiting transistor between said row line and said write voltage terminal.

2. The memory device according to claim 1, in which said current limiting transistor is a first P-channel MIS transistor and a gate of said first P-channel transistor is supplied with a potential which is lower than said write voltage.

3. The memory device according to claim 1, in which said connecting means includes a switching MIS transistor having a source-drain path connected in series with the source-drain path of said current limiting transistor, said switching transistor being rendered conductive in said write state and non-conductive in a read state.

4. The memory device according to claim 1, in which said row selection circuit includes a plurality of driver circuits each provided for each one of said row lines and a plurality of connecting MIS transistors each coupled between the output of one of said driver circuits and one of said row lines.

5. The memory device according to claim 1, in which each of said memory cells includes a floating gate type MIS transistor.

6. A non-volatile semiconductor memory device comprising:
   a plurality of word lines;
   a plurality of digit lines;
   a plurality of non-volatile memory cells each coupled to one of said word lines and one of said digit lines;
   a plurality of word driver circuits each provided for each of said word lines; and
   selection means responsive to row address information for selectively enabling one of said word driver circuits, the enabled word driver circuit raising the potential of the associated word line to a first potential in a read state and to a second potential higher than said first potential in a write state, the remaining word driver circuits other than said enabled word driver circuit setting the word lines associated therewith at a reference potential, each of said word driver circuits including:
   a first switch coupled between a first terminal receiving said first potential and a driving node;
   a second switch coupled between said driving node and a second terminal receiving said reference potential;
   means responsive to said selection means for enabling one of said first and second switches;
   first means for connecting said driving node to the associated word line; and
   a write voltage application circuit coupled between a third terminal receiving said second potential and the associated word line for supplying said second potential to said associated word line in said write state, said write voltage application circuit including a current limiting MIS transistor of an enhancement type, second means for connecting said current limiting transistor between said third terminal and said associated work line, and bias means for biasing the gates of each said current limiting transistor such that a limited amount of current flows therethrough at least in said write state.

7. The memory device according to claim 6, in which said bias means makes said current limiting transistors non-conductive in said read state.

8. The memory device according to claim 6, in which said current limiting transistors are P-channel MIS transistors and the gate potential of said current limiting transistors is selected to a potential which is lower than said second potential by 2 to 3 volts.

9. The memory device according to claim 6, in which said first means includes a MIS transistor having a source-drain path coupled between the driving node and the associated word line.

10. The memory device according to claim 6, in which said second means includes a MIS transistor having a source-drain path coupled between said current limiting transistor and the associated word line.

11. A non-volatile semiconductor memory device comprising:
    a first voltage terminal receiving a first voltage;
    a second voltage terminal receiving a second voltage higher than said first voltage;
    a reference voltage terminal receiving a reference voltage;
    a row line;
    a column line;
    a non-volatile memory cell transistor coupled to said row line and said column line;

a row selection circuit coupled to said row line, said
first voltage terminal and said reference voltage
terminal for selectively applying one of said first
voltage and said reference voltage to said row line
in response to row address information;
a write voltage application circuit coupled between
said write voltage terminal and said row line, said
write voltage application circuit including:
  a series connection of first and second P channel
  type field effect transistors connected in series
  between said write voltage terminal and said row
  line;
  a bias circuit for applying a gate of said first P
  channel type transistor with an intermediate
  voltage which is lower than said second voltage
  but higher than said first voltage at least in a
  write state; and
  control means for rendering said second P channel
  type field effect transistor conductive in said
  write state and non-conductive in a read state;
said non-volatile semiconductor memory deivice further comprising a column selection circuit coupled
to said column line, said first voltage terminal and
said second voltage terminal for selectively applying said first voltage to said column line in said read
state and said second voltage to said column line in
said write state.

12. The memory device according to claim 11, in which said row selection circuit includes:
  a third P type channel field effect transistor coupled between said first voltage terminal and an output node;
  a first N channel type field effect transistor coupled between said output node and said reference voltage terminal;
  means for applying a column address signal to gates of said third P channel type transistor and first N channel type transistor; and
  a second N channel type field effect transistor coupled between said output node and said column line and having a gate supplied with said first voltage.

13. The memory device according to claim 11, in which said intermediate voltage is lower than said second voltage by 2 to 3 volts.

14. A non-volatile semiconductor memory device comprising:
  a first voltage receiving a first voltage;
  a second voltage terminal receiving a second voltage higher than said first voltage;
  a reference voltage terminal receiving a reference voltage;
  a row line;
  a column line;
  a non-volatile memory cell transistor coupled to said row line and said column line;
  a row selection circuit coupled to said row line, said first voltage terminal and said reference voltage terminal for selectively applying one of said first voltage and said reference voltage to said row line in response to row address information, said row selection circuit including:
    a first P channel type field effect transistor coupled between said first voltage terminal and an output node;
    a first N channel type field effect transistor coupled between said output node and said reference voltage terminal;
    means for applying a column address signal to gates of said first P channel type transistor and first N channel type transistor; and
    a second N channel type field effect transistor coupled between said output node and said column line and having a gate supplied with said first voltage;
  said non-volatile semiconductor memory device further including a write voltage application circuit coupled between said write voltage terminal and said row line, said write voltage application circuit including:
    a series connection of second and third P channel type field effect transistors connected in series between said write voltage terminal and said row line;
    a bias circuit for applying a gate of said second P channel type transistor with an intermediate voltage which is lower than said second voltage but higher than said first voltage at least in a write state; and
    control means for rendering said third P channel type field effect transistor conductive in said write state and non-conductive in a read state;
  said non-volatile semiconductor memory device further including a column selection circuit coupled to said column line, said first voltage terminal and said second voltage terminal for selectively applying said first voltage to said column line in said read state and said second voltage to said column line in said write state.

15. The memory device according to claim 14, in which said intermediate voltage is lower than said second voltage terminal by 2 to 3 volts.

* * * * *

UNITED STATES PATENT AND TRADEMARK OFFICE
CERTIFICATE OF CORRECTION

PATENT NO. : 4,710,900

DATED : December 1, 1987

INVENTOR(S) : HIGUCHI

It is certified that error appears in the above-identified patent and that said Letters Patent is hereby corrected as shown below:

COLUMN 3, LINE 57  Delete "limitter" insert --limiter--

Signed and Sealed this

Twenty-seventh Day of September, 1988

Attest:

DONALD J. QUIGG

Attesting Officer

Commissioner of Patents and Trademarks